United States Patent
O'Gwynn

(10) Patent No.: US 11,463,491 B2
(45) Date of Patent: Oct. 4, 2022

(54) SYSTEMS AND METHODS FOR DC POWER AND DATA COMMUNICATION OVER A SINGLE PAIR OF WIRES, FOR A QUICK-SERVICE RESTAURANT

(71) Applicant: H.M. Electronics, Inc., Carlsbad, CA (US)

(72) Inventor: David O'Gwynn, Oceanside, CA (US)

(73) Assignee: H.M. Electronics, Inc., Carlsbad, CA (US)

( * ) Notice: Subject to any disclaimer, the term of this patent is extended or adjusted under 35 U.S.C. 154(b) by 272 days.

(21) Appl. No.: 15/929,884

(22) Filed: May 27, 2020

(65) Prior Publication Data

US 2021/0377321 A1    Dec. 2, 2021

(51) Int. Cl.
| | |
|---|---|
| G06Q 50/12 | (2012.01) |
| H04L 65/403 | (2022.01) |
| H03M 1/66 | (2006.01) |
| G10L 19/00 | (2013.01) |
| H03M 1/12 | (2006.01) |
| H04L 65/70 | (2022.01) |
| H04L 65/75 | (2022.01) |

(52) U.S. Cl.
CPC .......... *H04L 65/403* (2013.01); *G06Q 50/12* (2013.01); *G10L 19/00* (2013.01); *H03M 1/12* (2013.01); *H03M 1/66* (2013.01); *H04L 65/70* (2022.05); *H04L 65/75* (2022.05)

(58) Field of Classification Search
CPC ......... G06Q 50/12; G10L 19/00; H03M 1/12; H03M 1/66; H04L 65/103; H04L 65/301; H04L 65/307; H04W 88/08
See application file for complete search history.

(56) References Cited

U.S. PATENT DOCUMENTS

| | | | |
|---|---|---|---|
| 8,311,085 B2 | 11/2012 | Albiston | |
| 9,337,898 B2 | 5/2016 | Albiston | |
| 2014/0170984 A1* | 6/2014 | Awiszus | .................. G06Q 50/12 |
| | | | 455/67.11 |
| 2014/0279080 A1* | 9/2014 | O'Gwynn | .............. G06Q 50/12 |
| | | | 705/15 |
| 2016/0041941 A1* | 2/2016 | Kessler | ............... H04L 12/4035 |
| | | | 700/3 |
| 2017/0222829 A1* | 8/2017 | Kessler | ............ H04L 12/40039 |
| 2018/0034912 A1* | 2/2018 | Binder | .................... H04L 67/12 |
| 2019/0278733 A1* | 9/2019 | Kessler | ..................... G06F 1/26 |

* cited by examiner

*Primary Examiner* — Siu M Lee
(74) *Attorney, Agent, or Firm* — Esplin & Associates, PC

(57) ABSTRACT

Systems and methods for facilitating intercom communication for one or more quick-service restaurant drive-throughs are disclosed. Exemplary implementations may: capture sound from a customer placing an order; generate order information signals that represent the captured sound; encode signals to form order data packets; transmit the order data packets to a base station through a single pair of wires that is also used to provide power; decode information from the order data packets; and generate order sound based on the decoded information, such that the generated order sound is audible to a staff member of the quick service restaurant through a headset.

20 Claims, 7 Drawing Sheets

SYSTEMS AND METHODS FOR DC POWER AND DATA COMMUNICATION OVER A SINGLE PAIR OF WIRES, FOR A QUICK-SERVICE RESTAURANT

FIELD OF THE DISCLOSURE

The present disclosure relates to systems and methods for intercom communication for quick service restaurants.

BACKGROUND

Communication systems using a central communication device and an end-user communication device are known. Intercom communication is known.

SUMMARY

One aspect of the present disclosure relates to a system configured for facilitating intercom communication for one or more quick-service restaurant drive-throughs. The drive-throughs may include one or both of a menu board and a speaker post. The system may comprise an audio-order placement sub-system positionally associated with one or both of the menu board and the speaker post. The audio-order placement sub-system may comprise a microphone configured to capture sound from a customer placing an order at or near one or both of the menu board and the speaker post, and to generate (analog or digital) order information signals that represent the sound captured from the customer. In some implementations, the generated order information signals have an analog format. In some implementations, the audio-order placement sub-system may comprise an analog-to-digital converter configured to receive analog order information signals from the microphone and further configured to convert the order information signals to digital order information signals having a digital format. The audio-order placement sub-system may comprise an order-placement encoder configured to encode the digital order information signals to form order data packets. The audio-order placement sub-system may comprise an order-placement decoder configured to decode restaurant data packets from a base station into digital restaurant signals. The audio-order placement sub-system may comprise a digital-to-analog converter configured to convert the digital restaurant signals into restaurant signals. The audio-order placement sub-system may comprise a speaker configured to generate restaurant sound based on the restaurant signals such that the generated restaurant sound is audible to the customer at or near one or both of the menu board and the speaker post. The audio-order placement sub-system may comprise an order-placement transceiver configured to (i) transmit the order data packets from the audio-order placement sub-system to the base station through a single pair of wires, and (ii) receive the restaurant data packets from the base station through the single pair of wires. At least one of the analog-to-digital converter, the digital-to-analog converter, the order-placement encoder, the order-placement decoder, the speaker, and the order-placement transceiver may be powered by power transmitted from the base station through the single pair of wires. The audio-order placement sub-system may comprise the single pair of wires. The single pair of wires may be communicatively coupled between the audio-order placement sub-system and the base station. The system may comprise the base station. The base station may comprise one or more base station transceivers configured to (i) receive the order data packets as transmitted through the single pair of wires by the order-placement transceiver of the audio-order placement sub-system, (ii) transmit data packets based on the order data packets to the audio-order receipt sub-system, (iii) receive data packets based on the restaurant data packets from the audio-order receipt sub-system, and (iv) transmit the restaurant data packets through the single pair of wires to the order-placement transceiver of the audio-order placement sub-system. The base station may comprise a converter configured to (i) convert the data packets based on the restaurant data packets to restaurant data packets, and (ii) convert the order data packets to the data packets based on the order data packets. The system may comprise the audio-order receipt sub-system located remotely from the audio-order placement sub-system. The audio-order receipt sub-system may comprise an order-receipt decoder configured to decode the data packets based on the order data packets into digital order signals that represent the sound received from the customer. The audio-order receipt sub-system may comprise a digital-to-analog converter configured to convert the digital order signals to order signals. The audio-order receipt sub-system may comprise a headset configured to generate order sound based on the order signals, such that the generated order sound is audible to a staff member through the headset. The headset may be further configured to capture sound from the staff member through one or more headset microphones and to generate (analog or digital) restaurant information signals that represent the sound captured from the staff member. In some implementations, the audio-order receipt sub-system may comprise an analog-to-digital converter and be configured to convert the analog restaurant information signals to digital restaurant information signals. The audio-order receipt sub-system may comprise an order-receipt encoder configured to encode digital restaurant information signals to form the data packets based on the restaurant data packets. The format of the data packets based on the restaurant data packets may be proprietary and may be suitable for wireless transmission.

Another aspect of the present disclosure relates to a method for facilitating intercom communication for one or more quick-service restaurant drive-throughs. The method may comprise capturing, by a first microphone, sound from a customer placing an order at or near one or both of a menu board and a speaker post positionally associated with a first drive-through lane, and generating (analog or digital) order information signals that represent the sound captured from the customer. In some implementations, the order information signals may have an analog format. In some implementations, the method may comprise converting, by a first analog-to-digital converter, the order information signals to digital order information signals having a digital format. The method may comprise encoding, by a first encoder, the digital order information signals to form order data packets. The method may comprise decoding, by a first decoder, restaurant data packets from a base station into digital restaurant signals. The method may comprise converting, by a first digital-to-analog converter, the digital restaurant signals into restaurant signals. The method may comprise generating, by a speaker, restaurant sound based on the restaurant signals such that the generated restaurant sound is audible to the customer at or near one or both of the menu board and the speaker post. The method may comprise transmitting, by a first transceiver, the order data packets to the base station through a single pair of wires. The method may comprise receiving, by the first transceiver, the restaurant data packets from the base station through the single pair of wires. The method may comprise transmitting power through the single pair of wires. At least one of the first analog-to-digital converter, the first encoder, the first decoder, the first digital-to-analog converter, the speaker, and the first transceiver, may be powered by the transmitted power. The method may comprise receiving, by the base station, the order data packets as transmitted through the single pair of wires, and receiving data packets based on the restaurant data packets. The method may comprise transmitting, by the base station, the restaurant data packets through the single pair of wires, and transmitting data packets based on the order data packets. The method may comprise converting the data packets based on the restaurant data packets to the restaurant data packets, and the order data packets to the data packets based on the order data packets. The method may comprise decoding the data packets based on the order data packets into digital order signals that represent the sound received from the customer. The method may comprise converting the digital order signals to order signals. The method may comprise generating order sound based on the order signals, such that the generated order sound is audible to a staff member through a headset. The method may comprise capturing, by the headset, sound from the staff member through one or more headset microphones. The method may comprise generating restaurant information signals that represent the sound captured from the staff member. The method may comprise converting the restaurant information signals to digital restaurant information signals. The method may comprise encoding digital restaurant information signals to form the data packets based on the restaurant data packets.

As used herein, any association (or relation, or reflection, or indication, or correspondency) involving intercom communication systems, information processing units, processors, client computing platforms, portable communication devices, communication protocols, sub-systems, base stations, microphones, headsets, analog-to-digital converters, digital-to-analog converters, transceivers, encoders, decoders, data packets, information signals, sounds, wires, formats, standards, connections, instructions, messages, user interfaces, and/or another entity or object that interacts with any part of the system and/or plays a part in the operation of the system, may be a one-to-one association, a one-to-many association, a many-to-one association, and/or a many-to-many association or N-to-M association (note that N and M may be different numbers greater than 1).

As used herein, the term "obtain" (and derivatives thereof) may include active and/or passive retrieval, determination, derivation, transfer, upload, download, submission, and/or exchange of information, and/or any combination thereof. As used herein, the term "effectuate" (and derivatives thereof) may include active and/or passive causation of any effect, both local and remote. As used herein, the term "determine" (and derivatives thereof) may include measure, calculate, compute, estimate, approximate, generate, and/or otherwise derive, and/or any combination thereof. As used herein, the terms "connect" and "couple" (and derivatives thereof) may be used interchangeably to indicate a link between multiple components that may or may not include intermediary components.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

DETAILED DESCRIPTION

Figure 1:
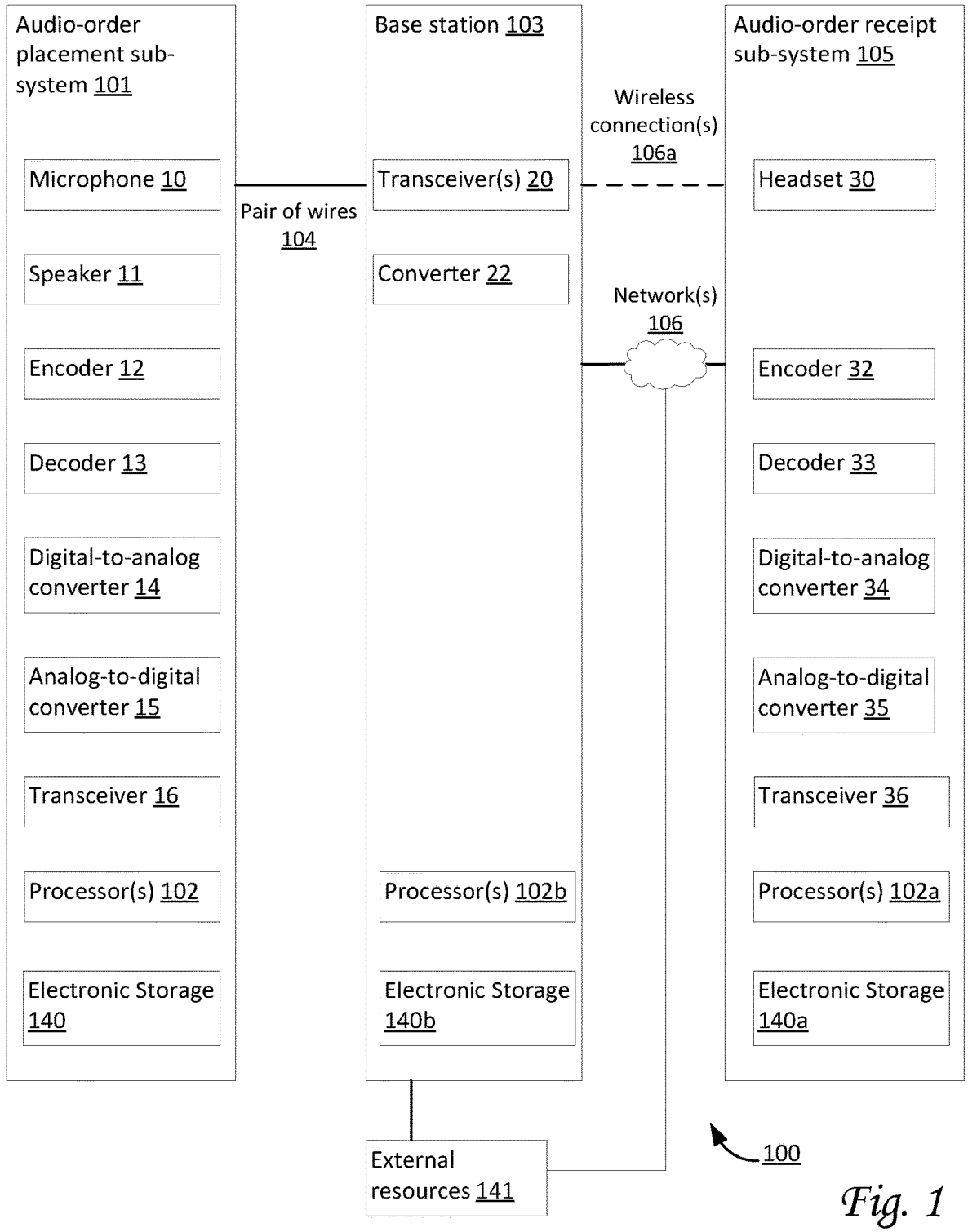
FIG. 1 illustrates a system configured for facilitating intercom communication for one or more quick-service restaurant drive-throughs, in accordance with one or more implementations.

FIG. 1 illustrates a system 100 configured for facilitating intercom communication for one or more quick-service restaurant drive-throughs, in accordance with one or more implementations. System 100 may be referred to as an intercom communication system, or as a communication system. In some implementations, system 100 may include an audio-order placement sub-system 101, one or more wires 104, a base station 103, an audio-order receipt sub-system 105, one or more networks 106, and/or other components and/or sub-systems. Users of system 100 may include customers (placing orders), staff members or crew (taking orders), managers and/or other stakeholders. In some implementations, orders may be placed by customers through audio-order placement sub-system 101, information pertaining to this order (e.g., based on the captured sound) may be transmitted through base station 103 (and/or networks 106 and/or one or more wireless connections 106a) to audio-order receipt sub-system 105. In some implementations, audio-order receipt sub-system 105 may be configured to perform automated order taking. In some implementations, audio-order receipt sub-system 105 may be configured to perform order taking remotely, at a remote order-processing center. In some implementations, audio-order receipt sub-system 105 may be configured to facilitate order taking locally at a quick-service restaurant, by staff members. In such cases, the pertinent information as transmitted by base station 103 may be received by staff members. Greetings, replies, and/or other sound by the staff members (which may be referred to as "restaurant sound") may be captured by audio-order receipt sub-system 105. Information pertaining to the restaurant sound may be transmitted through base station 103 to audio-order placement sub-system 101, where the pertinent information is audible for the customers. To some extent, sound from customers placing orders and restaurant sound (and the information derived therefrom) may traverse opposite communication paths in system 100. In some implementations, sound from customers placing orders and restaurant sound (and the information derived therefrom) may be exchanged and/or otherwise transmitted at the same time, similar to any conversation.

Audio-order placement sub-system 101 may be positionally associated with one or both of a menu board and a speaker post (not depicted). In some implementations, one or both of the menu board and the speaker post may be part of a drive-through lane of a restaurant, e.g., a quick-service-restaurant. Audio-order placement sub-system 101 may include one or more of a microphone 10, a speaker 11, an encoder 12, a decoder 13, a digital-to-analog converter 14, an analog-to-digital converter 15, a transceiver 16, one or more processors 102, electronic storage 140, and/or other components. Components of audio-order placement sub-system 101 may be referred to as "order-placement" components. For example, encoder 12 may be referred to as order-placement encoder 12, and so forth.

Microphone 10 may be configured to capture sound. For example, in some implementations, microphone 10 may be configured to capture sound from a customer placing an order (and/or otherwise communicating with staff members) at or near one or both of a menu board and a speaker post. For example, in some implementations, microphone 10 may be included, embedded, and/or otherwise integrated into the speaker post of a drive-through lane of a quick-service restaurant. The captured sound may be referred to as "order sound". In some implementations, microphone 10 may be configured to generate (analog or digital) information signals that represent the captured sound. For example, microphone 10 may be configured to generate order information signals that represent the order sound captured from the customer placing the order. In some implementations, the generated information signals may have an analog format. In some implementations, the generated information signals may have a digital format.

In some implementations, analog-to-digital converter 15 may be configured to receive analog information signals from microphone 10. In some implementations, analog-to-digital converter 15 may be configured to convert analog signals to digital signals. For example, analog-to-digital converter 15 may be configured to convert the received information signals to digital information signals that have a digital format. For example, analog-to-digital converter 15 may be configured to convert (analog) order information signals to digital order information signals. In some implementations, analog-to-digital converter 15 may be integrated into microphone 15, such that microphone 15 generates digital information signals that represent the captured sound.

Encoder 12 may be configured to encode digital information signals to form data packets. In some implementations, the data packets may conform to a network communication standard. For example, the data packets may conform to a network communication standard in accordance with IEEE 1901. For example, (order-placement) encoder 12 may be configured to encode digital order information signals (e.g., as generated by analog-to-digital converter 15) to form order data packets that conform to IEEE 1901. In some implementations, the formed data packets may conform to one or more other stream or packet-based standards.

Transceiver 16 may be configured to transmit and/or receive data packets. In some implementations, transceiver 16 may be configured to transmit and/or receive information via one or more communication links. In some implementations, (order-placement) transceiver 16 may be configured to transmit order data packets from audio-order placement sub-system 101 to base station 103. In some implementations, transceiver 16 may be configured to transmit data packets through pair of wires 104 (e.g., through a single pair of wires). In some implementations, transceiver 16 may be configured to transmit data packets through an Ethernet cable. In some implementations, (order-placement) transceiver 16 may be configured to receive (restaurant) data packets from base station 103, e.g., through the same single pair of wires. In some implementations, system 100 and/or transceiver 16 may be configured to use differential signaling over the single pair of wires.

Decoder 13, digital-to-analog converter 14, and speaker 11 of audio-order placement sub-system 101 will be described below.

In some implementations, the only wires that are communicatively coupled between audio-order placement sub-system 101 and base station 103 may be a single pair of wires (pair of wires 104). In some implementations, single pair of wires 104 may be a twisted pair. In some implementations, single pair of wires 104 may be included in a balanced cable. In some implementations, communication via pair of wires 104 may use differential signaling. In some implementations, the wires that are communicatively coupled between audio-order placement sub-system 101 and base station 103 include more than two wires, but the transmission of (standardized) data packets may be performed such that only two of these wires are used to transmit data during the transmission of the data packets. For example, in some implementations, these wires may include a ground wire (which does not transmit data). For example, in some implementations, these wires may include one or more additional (pairs of) wires that are not used to transmit the data of the data packets during the transmission of the data packets as described in this disclosure.

In some implementations, at least one of analog-to-digital converter 15, digital-to-analog converter 14, order-placement encoder 12, order-placement decoder 13, speaker 11, and order-placement transceiver 16 is powered by power transmitted from base station 103 through the single pair of wires. In some implementations, power may be transmitted by base station 103 by applying a common voltage relative to ground to each wire in pair of wires 104 (and, e.g., using another wire as a ground wire). In some implementations, power may be transmitted by base station 103 by applying a differential voltage between the two wires in pair of wires 104 (e.g., using AC or DC, such as a DC voltage of nominally 48V). In some implementations, audio-order placement sub-system 101 may be configured to receive and/or otherwise extract power from pair of wires 104. In some implementations, at least two of analog-to-digital converter 15, digital-to-analog converter 14, order-placement encoder 12, order-placement decoder 13, speaker 11, and order-placement transceiver 16 are powered by power transmitted from base station 103 through pair of wires 104. In some implementations, at least three of analog-to-digital converter 15, digital-to-analog converter 14, order-placement encoder 12, order-placement decoder 13, speaker 11, and order-placement transceiver 16 are powered by power transmitted from base station 103 through pair of wires 104. In some implementations, audio-order placement sub-system 101 is powered by power transmitted from base station 103 through pair of wires 104. In some implementations, additional components not depicted in FIG. 1 (such as cameras, vehicle-detection blocks, (ultra-sonic) sensors, and/or other components commonly used in a drive-through lane) may be powered by power transmitted from base station 103 through pair of wires 104.

Decoder 13 may be configured to decode data packets into digital signals. In some implementations, the data packets may have been transmitted by base station 103, and subsequently provided to audio-order placement sub-system 101. In some implementations, decoder 13 may be configured to decode restaurant data packets into digital restaurant signals (having a digital format). For example, in some implementations, restaurant data packets may conform to a network communication standard in accordance with IEEE 1901. For example, the restaurant data packets may conform to another streaming or packet-based standard. The digital restaurant signals may represent restaurant sound. For example, the digital restaurant signals may represent sound received and/or captured from staff members taking an order from a customer (and/or otherwise communicating with customers).

Digital-to-analog converter 14 may be configured to receive digital restaurant signals, e.g., from (order placement) decoder 13. Order-placement digital-to-analog converter 14 may be configured to convert digital signals to analog signals. For example, order-placement digital-to-analog converter 14 may be configured to convert the received digital restaurant signals to restaurant signals that have an analog format.

Speaker 11 may be configured to generate sound, e.g. restaurant sound, based on signals (e.g., restaurant signals). For example, speaker 11 may be configured to generate sound based on restaurant signals received from order-placement digital-to-analog converter 14. In some implementations, speaker 11 may be configured such that the generated sound is audible to one or more customers.

Audio-order placement sub-system 101 (and/or one or more of its components) may include one or more processors 102. In some implementations, processor(s) 102 may be configured by machine-readable instructions. The machine-readable instructions may include one or more instruction components. The instruction components may include computer program components. By way of non-limiting example, certain features and/or functionality of encoder 12 may be implemented as one or more instruction components. Processor(s) 102 may include communication lines, or ports to enable the exchange of information with a network and/or computing platforms. Illustration of processor(s) 102 in FIG. 1 is not intended to be limiting. Processor(s) 102 may include a plurality of hardware, software, and/or firmware components operating together to provide the functionality attributed herein to processor(s) 102. For example, processor(s) 102 may be implemented by a cloud of computing platforms operating together as processor(s) 102. Processor(s) 102 may be configured to provide information processing capabilities in system 100. In some implementations, processor(s) 102 may include one or more of a digital processor, an analog processor, a digital circuit designed to process information, an analog circuit designed to process information, a state machine, and/or other mechanisms for electronically processing information. Processor(s) 102 may be physically located within the same device, or processor(s) 102 may represent processing functionality of a plurality of devices operating in coordination. As used herein, the term "component" may refer to any component or set of components that perform the functionality attributed to the component. This may include one or more physical processors during execution of processor readable instructions, the processor readable instructions, circuitry, hardware, storage media, or any other components.

Audio-order placement sub-system 101 (and/or one or more of its components) may include electronic storage 140. Electronic storage 140 may comprise non-transitory storage media that electronically stores information. The electronic storage media of electronic storage 140 may include one or both of system storage that is provided integrally (i.e., substantially non-removable) with processor(s) 102 and/or removable storage that is removably connectable to processor(s) 102 via, for example, a port (e.g., a USB port, a firewire port, etc.) or a drive (e.g., a disk drive, etc.). Electronic storage 140 may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. Electronic storage 140 may include one or more virtual storage resources (e.g., cloud storage, a virtual private network, and/or other virtual storage resources). Electronic storage 140 may store software algorithms, machine-readable instructions, information determined by processor(s) 102, information received from processor(s) 102, and/or other information that enables system 100 to function as described herein.

Referring to FIG. 1, in some implementations, base station 103 may include one or more base station transceivers 20, converter 22, one or more processors 102b, electronic storage 140b, and/or other components. One or more base station transceivers 20 may be configured to transmit and/or receive data packets, e.g., through pair of wires 104 and/or through other connections, including but not limited to wireless connection 106a. For example, one or more base station transceivers 20 may be configured to receive data packets from audio-order placement sub-system 101 and/or audio-order receipt sub-system 105. For example, a first base station transceivers 20 may be configured to transmit data packets to audio-order placement sub-system 101, a second (and/or third) base station transceiver 20 may be configured to transmit data packets to audio-order receipt sub-system 105. For example, first base station transceivers 20 may be configured to receive data packets from audio-order placement sub-system 101, a second (and/or third) base station transceiver 20 may be configured to receive data packets from audio-order receipt sub-system 105. Processor(s) 102b may be similar to processors 102 as described above in relation to audio-order placement sub-system 101, though included in base station 103. Electronic storage 140b may be similar to electronic storage 140 as described above in relation to audio-order placement sub-system 101, though included in base station 103. In some implementations, one or more transceivers 20 may be external to base station 103.

Converter 22 may be configured to convert data packets. By way of non-limiting example, converter 22 may convert restaurant data packets to other data packets that are based on the restaurant data packets, including but not limited to standardized restaurant data packets. Conversion by converter 22 may be performed in either direction, such as from a standardized format to a proprietary format, and/or vice versa. By way of non-limiting example, converter 22 may convert order data packets to other data packets that are based on the order data packets. For example, packets may have a standardized format. The standardized format may conform to a network communication standard. In some implementations, the standardized format may conform to a network communication standard in accordance with IEEE 1901. In some implementations, packets that do not have a standardized format may have a proprietary format.

In some implementations, base station 103 may be configured to transmit and/or otherwise provide power through pair of wires 104 to audio-order placement sub-system 101 (and/or components thereof). In some implementations, power may be transmitted by base station 103 by applying a common voltage to each wire in pair of wires 104. In some implementations, power may be transmitted by base station 103 by applying a voltage differential between the two wires in pair of wires 104. Audio-order placement sub-system 101 may be configured to receive and/or otherwise extract power from pair of wires 104. In some implementations, the transmission of power may be referred to as Power over Data Lines (PoDL). In some implementations, the transmission of power may be in parallel with the transmission of data. In some implementations, the transmission of power may conform to an IEEE standard, including but not limited to IEEE 1901 and/or other IEEE-standards. In some implementations, one or more base station transceivers 20 may be configured to provide power through one or more pairs of wires, including, by way of non-limiting example, pair of wires 104.

In some implementations, audio-order receipt sub-system 105 may be located remotely from audio-order placement sub-system 101. In some implementations, audio-order receipt sub-system 105 may be configured to perform (or at least support) automated order taking. In some implementations, audio-order receipt sub-system 105 may be configured to facilitate order taking locally at a quick-service restaurant, by staff members. In some implementations, audio-order receipt sub-system 105 may include one or more of a headset 30, an encoder 32, a decoder 33, a digital-to-analog converter 34, an analog-to-digital converter 35, a transceiver 36, one or more processors 102*a*, electronic storage 140*a*, and other sub-systems and/or components. Components of audio-order receipt sub-system 105 may be referred to as "order-receipt" components. For example, encoder 32 may be referred to as order-receipt encoder 32, and so forth. One or more components of audio-order receipt sub-system 105 may be communicatively coupled to base station 103 via one or more networks 106, via wired connections, via wireless connections (such as wireless connection 106*a*, wireless connection 106*b*, and/or wireless connection 106*c*, shown in FIG. 1-2-3), and/or via combinations thereof. One or more networks 106 may include the Internet and/or other communication networks without limitation.

Order-receipt transceiver 36 may be configured to transmit and/or receive data packets. In some implementations, the data packets may conform to a standard, e.g., an IEEE standard. In some implementations, the data packets may have a proprietary format. In some implementations, transceiver 36 may be configured to transmit and/or receive information via one or more communication links. In some implementations, (order-receipt) transceiver 36 may be configured to transmit data packets based on restaurant data packets from audio-order receipt sub-system 105 to base station 103. In some implementations, transceiver 36 may be configured to transmit data packets wirelessly (e.g., through wireless connection 106*a*). In some implementations, transceiver 36 may be configured to receive (order) data packets from base station 103, e.g., through wireless connection 106*a*.

Order-receipt decoder 33 may be configured to decode data packets into digital signals. In some implementations, the data packets may have been received by base station 103, and subsequently converted and provided to audio-order receipt sub-system 105. In some implementations, decoder 33 may be configured to decode data packets based on order data packets into digital order signals (having a digital format). For example, data packets based on order data packets may be suitable for wireless transmission. For example, the data packets based on order data packets may have a packet-based format. The digital order signals may represent sound. For example, the digital order signals may represent sound received and/or captured from the customer placing an order (and/or otherwise communicating with staff members).

Order-receipt digital-to-analog converter 34 may be configured to receive digital order signals from order-receipt decoder 33. Order-receipt digital-to-analog converter 34 may be configured to convert digital signals to analog signals. For example, order-receipt digital-to-analog converter 34 may be configured to convert the received digital order signals to order signals that have an analog format.

Headset 30 may be configured to generate sound, e.g. order sound, based on signals (e.g., order signals). For example, headset 30 may be configured to generate sound based on order signals received from order-receipt digital-to-analog converter 34. In some implementations, headset 30 may be configured such that the generated sound is audible to one or more staff members through headset 30 (or multiple headsets similar to headset 30). In some implementations, headset 30 may include one or more headset microphones configured to capture sound from one or more staff members. In some implementations, the one or more headset microphones may be configured to generate (analog or digital) restaurant information signals that represent the sound captured (e.g., the sound as produced by the one or more staff members).

In some implementations, analog-to-digital converter 35 may be configured to receive restaurant information signals from headset 30. In some implementations, analog-to-digital converter 35 may be configured to convert analog signals to digital signals. For example, analog-to-digital converter 35 may be configured to convert the analog restaurant information signals to digital restaurant information signals that have a digital format.

Encoder 32 may be configured to encode certain signals to form data packets. For example, encoder 32 may be configured to encode digital restaurant information signals (e.g., as produced by analog-to-digital converter 35) to form restaurant data packets. In some implementations, the restaurant data packets may have a proprietary format, e.g., suitable for wireless transmission to base station 103.

Audio-order receipt sub-system 105 may include one or more processors 102*a*, electronic storage 140*a*, and/or other components. Processor(s) 102*a* may be similar to processor(s) 102 as described above in relation to audio-order placement sub-system 101, though included in audio-order receipt sub-system 105. Electronic storage 140*a* may be similar to electronic storage 140 as described above in relation to audio-order placement sub-system 101, though included in audio-order receipt sub-system 105. For example, electronic storage 140*b* may include machine-readable instructions through which processor(s) 102*a* are configured.

Referring to FIG. 1, external resources 141 may include sources of information outside of system 100, external entities participating with system 100, and/or other resources. In some implementations, external resources 141 may be communicatively coupled through one or more networks 106. In some implementations, external resources 141 may be communicatively coupled to base station 103. In some implementations, external resources 141 may include a remote order-processing center, which may perform (automated) order taking. In some implementations, some or all of the functionality attributed herein to external resources 141 may be provided by resources included in system 100.

Figure 2:
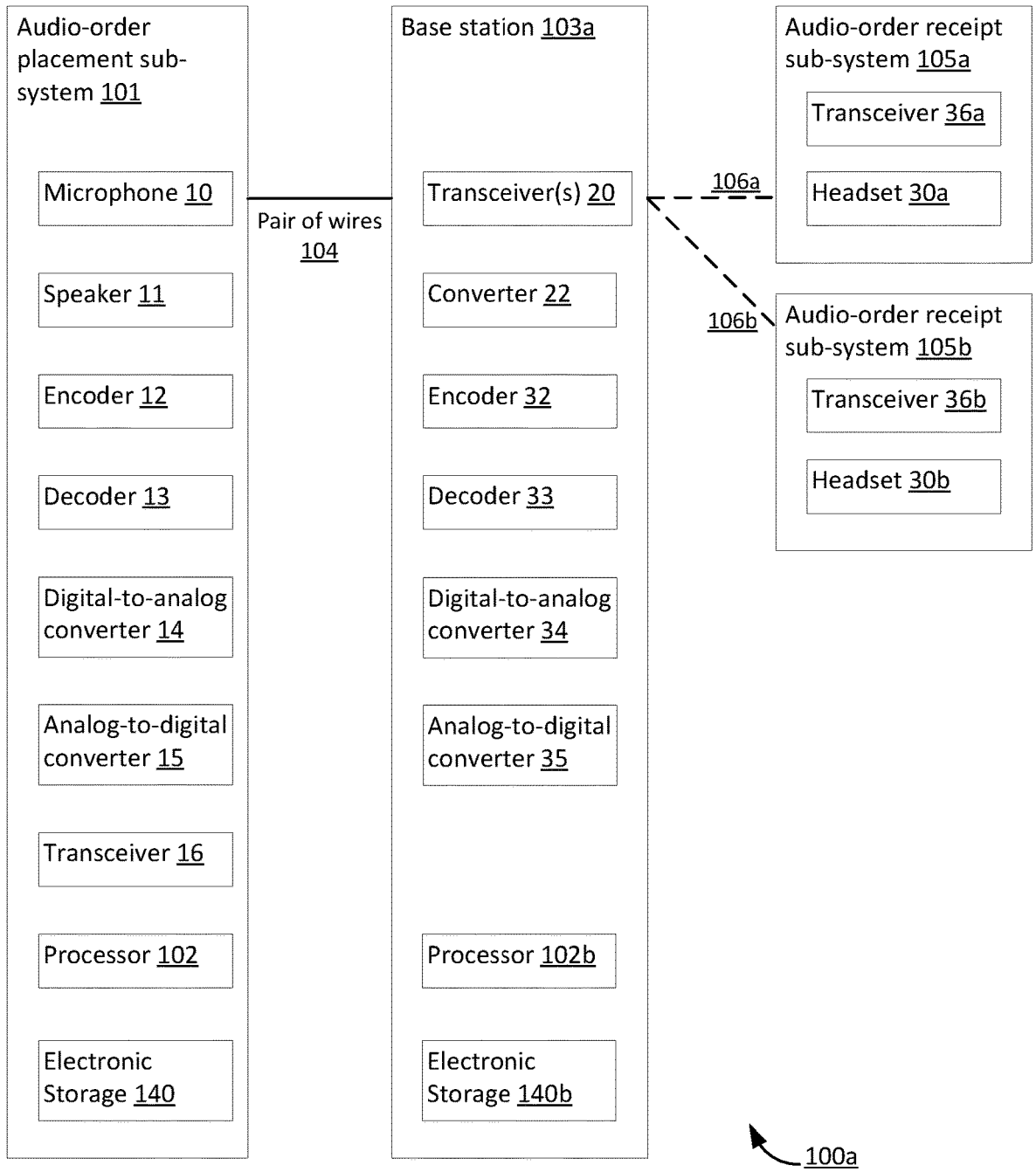
FIG. 2 illustrates an implementation of a system for facilitating intercom communication for one or more quick-service restaurant drive-throughs.

In some implementations, system 100 may include more than one of audio-order receipt sub-system 105 or of its components. For example, some quick service restaurants may use or support two staff members taking orders. By way of non-limiting example, FIG. 2 illustrates an exemplary system 100a that is similar to system 100 in FIG. 1 (meaning that similarly named components have similar features and/or capabilities), but that includes two audio-order receipt subsystems, a first audio-order receipt subsystem 105a and a second audio-order receipt subsystem 105b. Audio-order receipt subsystem 105a may include a first headset 30a similar to headset 30 in FIG. 1 and a first transceiver 36a similar to transceiver 36 in FIG. 1, and be communicatively coupled to base station 103a via a wireless connection 106a. Audio-order receipt subsystem 105b may include a second headset 30b similar to headset 30 in FIG. 1 and a second transceiver 36b similar to transceiver 36 in FIG. 1, and be communicatively coupled to base station 103a via a wireless connection 106b. As depicted in FIG. 2, some components that were included in audio-order receipt subsystem 105 in FIG. 1 may alternatively be included in base station 103a.

Figure 3A:
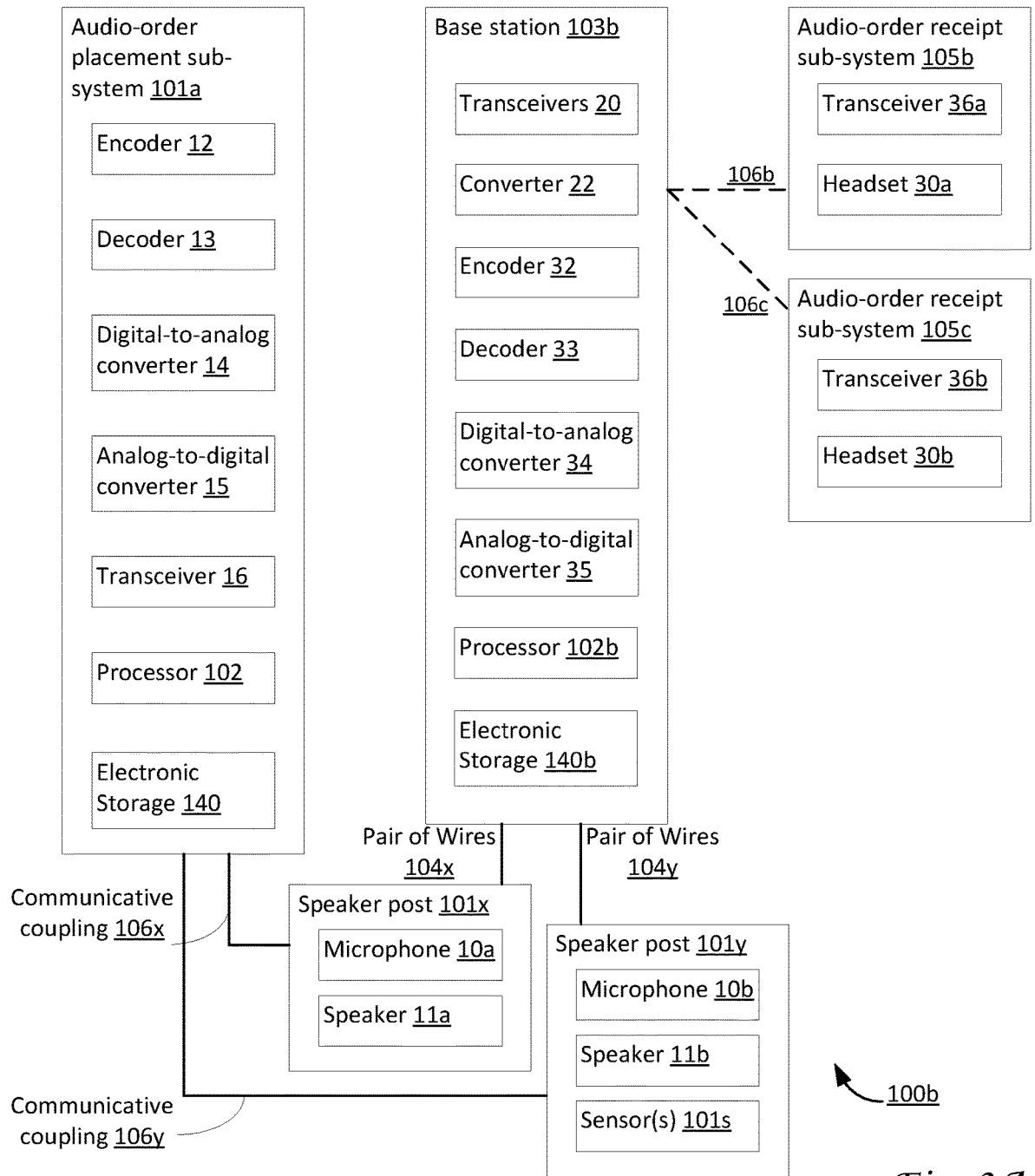
FIGS. 3A-3B-3C illustrate exemplary systems configured for facilitating intercom communication for multiple quick-service restaurant drive-throughs, in accordance with one or more implementations.

In some implementations, system 100 may include more than one of audio-order placement sub-system 101 or of its components. For example, some quick service restaurants may have two or more drive through lanes, and system 100 may for such cases include two or more speaker posts, two or more menu boards, two or more microphones similar to microphone 10, and/or two or more speakers similar to speaker 11, and so forth. By way of non-limiting example, FIG. 3A illustrates an exemplary system 100b that is similar to system 100 in FIG. 1 and system 100a in FIG. 2 (meaning that similarly named components have similar features and/or capabilities), but that includes two speaker posts, one of which is a speaker post 101x (e.g., as part of a first drive-through lane) connected to a base station 103b via a pair of wires 104x. Speaker post 101x may include a microphone 10a, a speaker 11a, and/or other components. Exemplary system 100b further includes a speaker post 101y (e.g., as part of a second drive-through lane) connected to base station 103b via a pair of wires 104y. Speaker post 101y may include a microphone 10b, a speaker 11b, one or more sensors 101s, and/or other components. For example, sensors 101s may include one or more video and/or photography cameras, one or more vehicle-detection loops, and/or one or more other sensors commonly used in a drive-through lane. One or more individual sensors in sensors 101s may be powered by power transmitted from base station 103b through pair of wires 104y. Speaker post 101x may be communicatively coupled to audio-order placement sub-system 101a via a communicative coupling 106x (which may include, e.g., one or more wires). Speaker post 101y may be communicatively coupled to audio-order placement sub-system 101a via a communicative coupling 106y (which may include, e.g., one or more wires). In some implementations, one or more other components of audio-order placement sub-system 101a may be duplicated as desired such that individual components may only perform their described operations for a single drive-through lane. Exemplary system 100b further includes a first audio-order receipt subsystem 105b and a second audio-order receipt subsystem 105c. Audio-order receipt subsystem 105b may include a first headset 30a similar to headset 30 in FIG. 1 and a first transceiver 36a similar to transceiver 36 in FIG. 1, and be communicatively coupled to base station 103a via a wireless connection 106b. Audio-order receipt subsystem 105c may include a second headset 30b similar to headset 30 in FIG. 1 and a second transceiver 36b similar to transceiver 36 in FIG. 1, and be communicatively coupled to base station 103a via a wireless connection 106c.

Figure 3B:
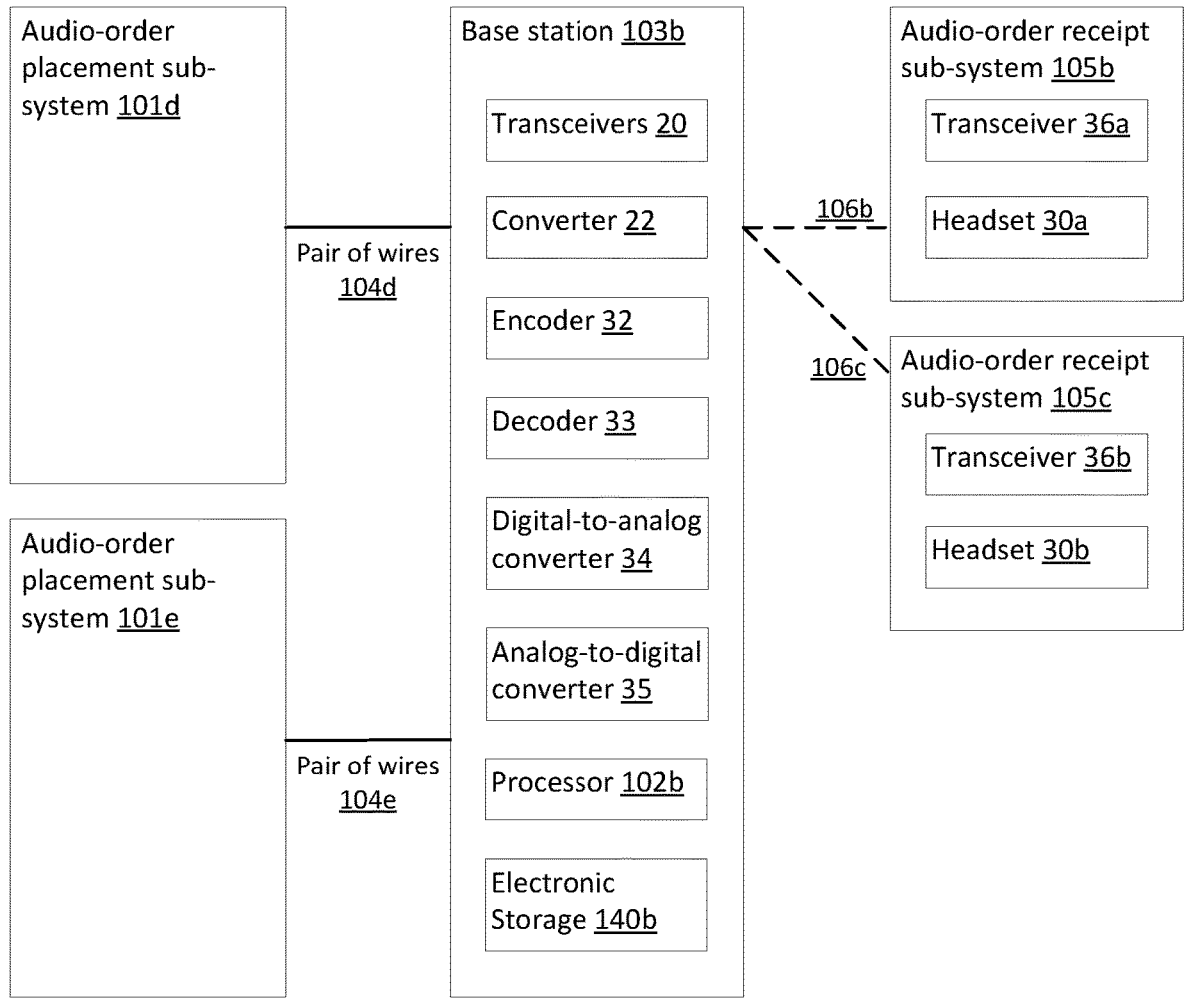

By way of non-limiting example, FIG. 3B illustrates an exemplary system 100c that is similar to system 100 in FIG. 1, system 100a in FIG. 2, and system 100b in FIG. 3A (meaning that similarly named components have similar features and/or capabilities), but that includes two audio-order placement sub-systems, audio-order placement sub-system 101d and audio-order placement sub-system 101e (e.g., as part of a first drive-through lane and a second drive-through lane, respectively) connected to base station 103b via a pair of wires 104d and a pair of wires 104e, respectively. In some implementations, audio-order placement sub-system 101d and audio-order placement sub-system 101e may be self-contained units. For example, each of audio-order placement sub-system 101d and audio-order placement sub-system 101e may be integrated, embedded, and/or otherwise included in a separate speaker post. Exemplary system 100c further includes first audio-order receipt subsystem 105b and second audio-order receipt subsystem 105c, similar to previously described exemplary systems.

Figure 3C:
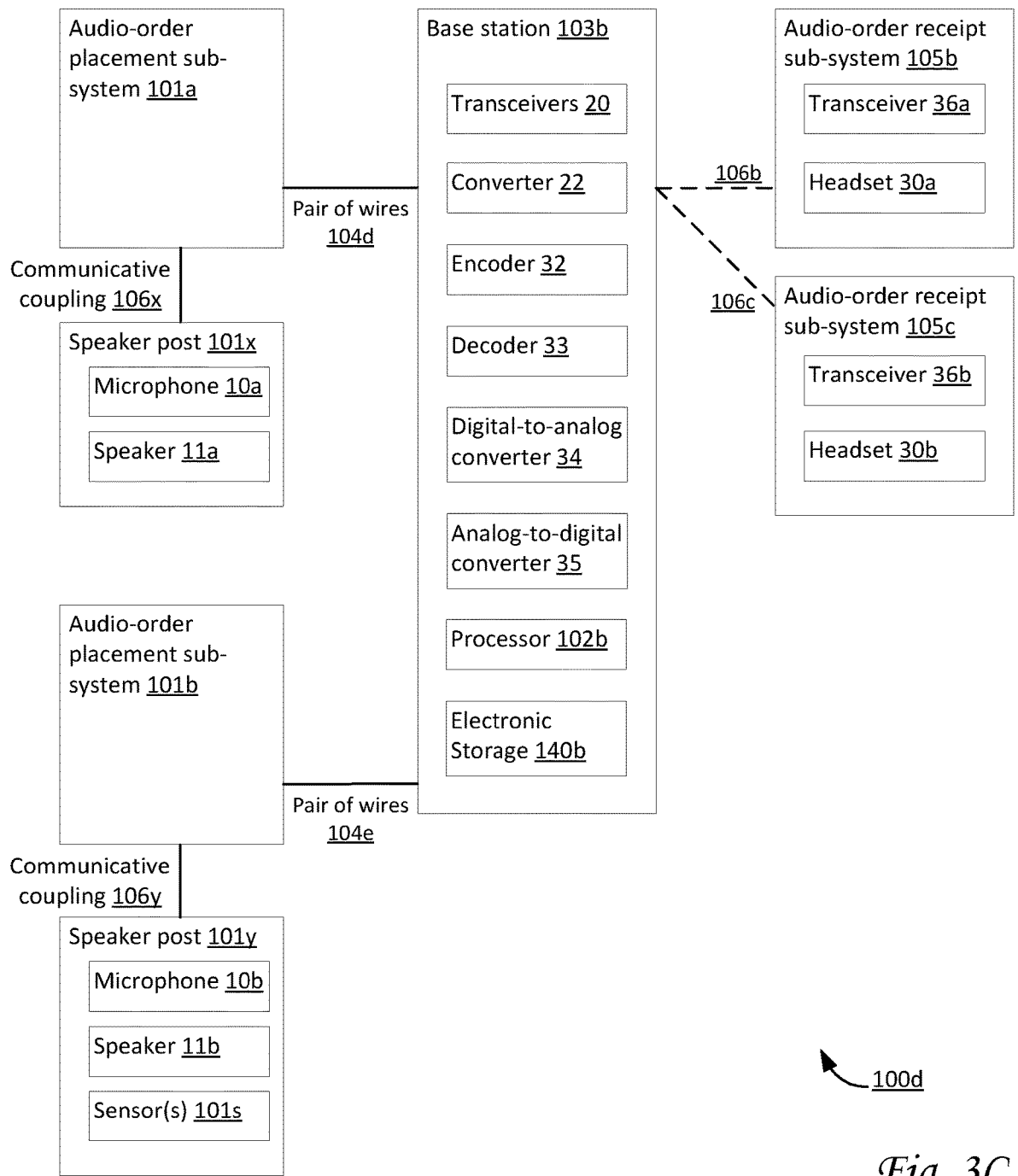

By way of non-limiting example, FIG. 3C illustrates an exemplary system 100d that is similar to system 100 in FIG. 1, system 100a in FIG. 2, system 100b in FIG. 3A, and system 100c in FIG. 3B (meaning that similarly named components have similar features and/or capabilities), and that includes two audio-order placement sub-systems, audio-order placement sub-system 101a and an audio-order placement sub-system 101b (e.g., as part of a first drive-through lane and a second drive-through lane, respectively) connected to base station 103b via a pair of wires 104d and a pair of wires 104e, respectively. In some implementations, audio-order placement sub-system 101a and audio-order placement sub-system 101b may be separated from their microphones and speakers, as depicted. Audio-order placement sub-system 101a may be communicatively coupled to speaker post 101x (e.g., as part of a first drive-through lane) via communicative coupling 106x. Audio-order placement sub-system 101b may be communicatively coupled to speaker post 101y (e.g., as part of a second drive-through lane) via communicative coupling 106y. Exemplary system 100d further includes first audio-order receipt subsystem 105b and second audio-order receipt subsystem 105c, similar to previously described exemplary systems.

In some implementations where system 100 includes more than one of audio-order placement sub-system 101 or of its components, a first audio-order placement sub-system may be positionally associated with a first speaker post (and/or a first menu board), and a second audio-order placement sub-system may be positionally associated with a second speaker post (and/or a second menu board). In some implementations, the second audio-order placement sub-system may be communicatively coupled to base station 103 through a second pair of wires that is entirely independent and separate from pair of wires 104. For example, the second pair of wires may extend from base station 103 such that data packets transmitted from base station 103 to the second audio-order placement sub-system are not transmitted through (first) audio-order placement sub-system 101. For example, base station 103, the first audio-order placement sub-system, and the second audio-order placement sub-system may be arranged in a point-to-point topology. In some implementations, communication with the first audio-order placement sub-system may use different addresses than communication with the second audio-order placement sub-system.

In some implementations where system 100 includes more than one of audio-order placement sub-system 101 or of its components, a first audio-order placement sub-system may be positionally associated with a first speaker post (and/or a first menu board), and a second audio-order placement sub-system may be positionally associated with a second speaker post (and/or a second menu board). In some implementations, the second audio-order placement sub-system may be communicatively coupled to base station 103 through a second pair of wires that extends pair of wires 104. For example, the second pair of wires extends such that data packets transmitted from base station 103 with a destination of the second audio-order placement sub-system (e.g., by virtue of the addresses used in the data packets) are transmitted through (first) audio-order placement sub-system 101.

Figure 4A:
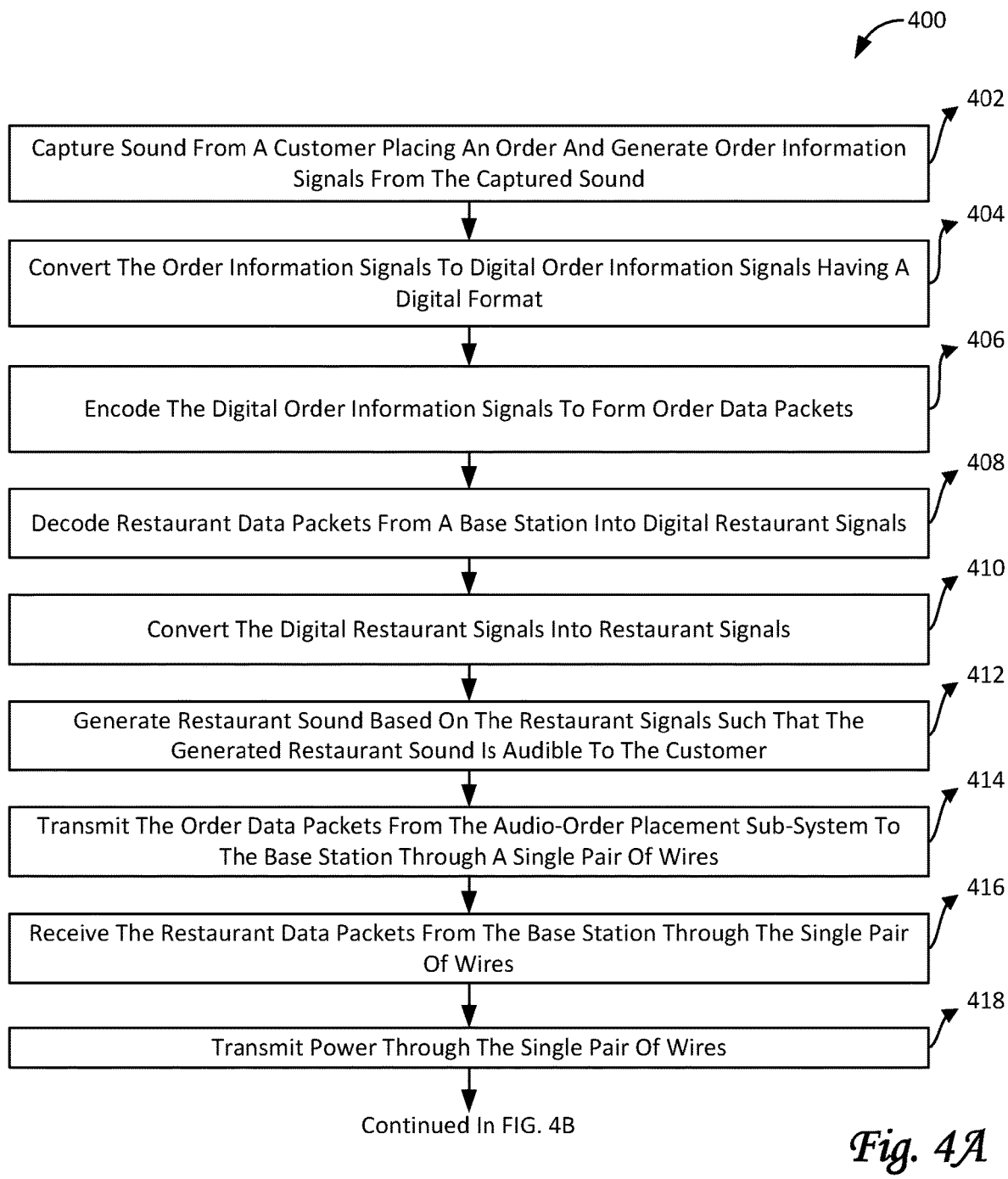
FIGS. 4A-4B illustrate a method for facilitating intercom communication for one or more quick-service restaurant drive-throughs, in accordance with one or more implementations.
Figure 4B:
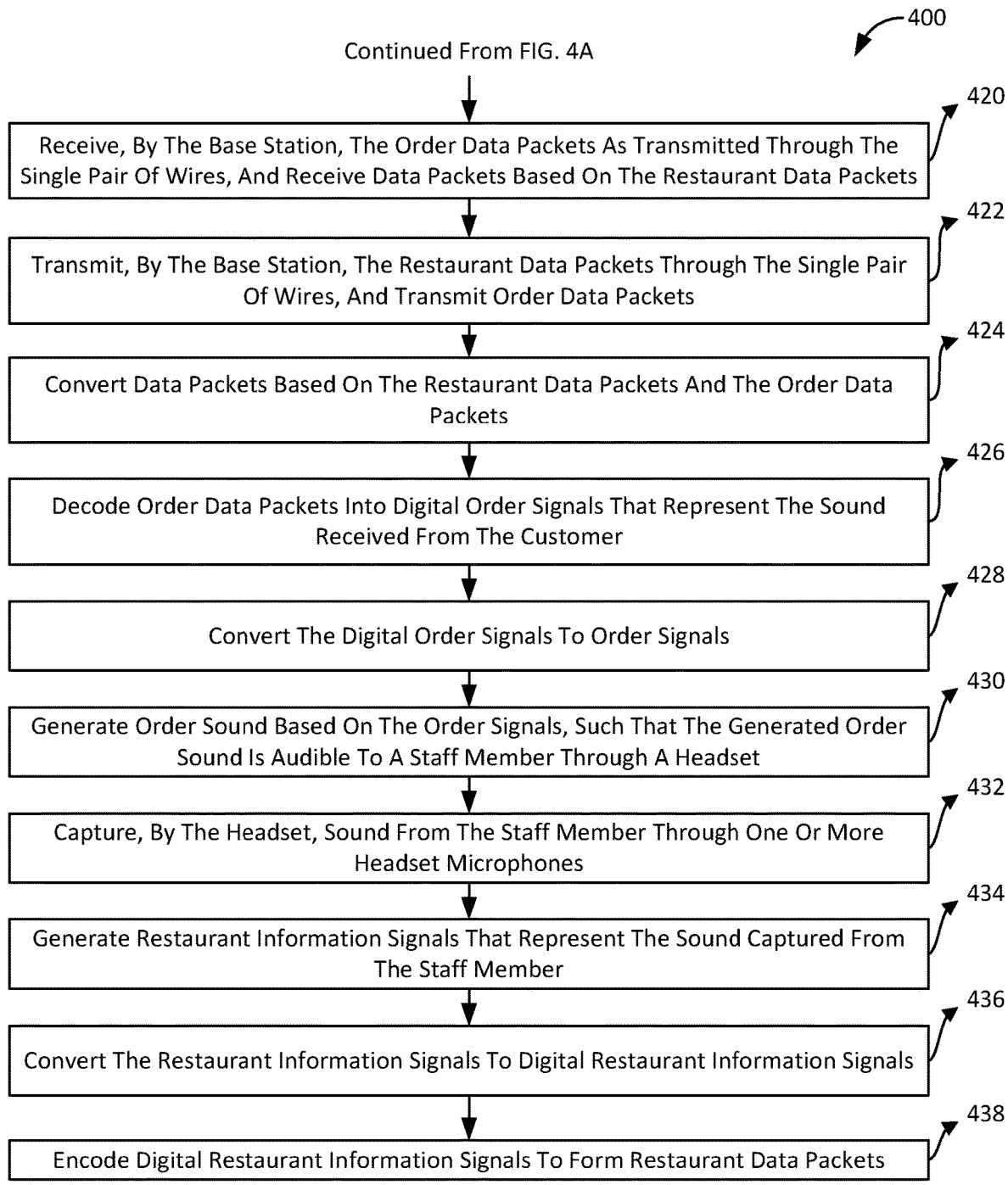

FIGS. 4A-4B illustrates a method 400 for facilitating intercom communication for one or more quick-service restaurant drive-throughs, in accordance with one or more implementations. The operations of method 400 presented below are intended to be illustrative. In some implementations, method 400 may be accomplished with one or more additional operations not described, and/or without one or more of the operations discussed. Additionally, the order in which the operations of method 400 are illustrated in FIGS. 4A-4B and described below is not intended to be limiting.

In some implementations, method 400 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 400 in response to instructions stored electronically on an electronic storage medium. The one or more processing devices may include one or more devices configured through hardware, firmware, and/or software to be specifically designed for execution of one or more of the operations of method 400.

At an operation 402, sound is captured, by a first microphone, from a customer placing an order at or near one or both of a menu board and a speaker post positionally associated with a first drive-through lane, and generating order information signals that represent the sound captured from the customer. The order information signals may have an analog format. In some embodiments, operation 402 is performed by a microphone the same as or similar to microphone 10 (shown in FIG. 1 and described herein).

At an operation 404, the order information signals are converted, by a first analog-to-digital converter, to digital order information signals having a digital format. In some embodiments, operation 404 is performed by an analog-to-digital converter the same as or similar to analog-to-digital converter 15 (shown in FIG. 1 and described herein).

At an operation 406, the digital order information signals are encoded, by a first encoder, to form order data packets that may conform to a network communication standard. In some embodiments, operation 406 is performed by an encoder the same as or similar to encoder 12 (shown in FIG. 1 and described herein).

At an operation 408, restaurant data packets are decoded, by a first decoder, from a base station into digital restaurant signals. The restaurant data packets may conform to a network communication standard. In some embodiments, operation 408 is performed by a decoder the same as or similar to decoder 13 (shown in FIG. 1 and described herein).

At an operation 410, the digital restaurant signals are converted, by a first digital-to-analog converter, into restaurant signals. In some embodiments, operation 410 is performed by a digital-to-analog converter the same as or similar to digital-to-analog converter 14 (shown in FIG. 1 and described herein).

At an operation 412, restaurant sound is generated, by a speaker, based on the restaurant signals such that the generated restaurant sound is audible to the customer at or near one or both of the menu board and the speaker post. In some embodiments, operation 412 is performed by a speaker the same as or similar to speaker 11 (shown in FIG. 1 and described herein).

At an operation 414, the order data packets are transmitted, by a first transceiver, to the base station through a single pair of wires. In some embodiments, operation 414 is performed by a transceiver the same as or similar to transceiver 16 (shown in FIG. 1 and described herein).

At an operation 416, the restaurant data packets are received, by the first transceiver, from the base station through the single pair of wires. In some embodiments, operation 416 is performed by a transceiver the same as or similar to transceiver 16 (shown in FIG. 1 and described herein).

At an operation 418, power is transmitted through the single pair of wires. At least one of the first analog-to-digital converter, the first encoder, the first decoder, the first digital-to-analog converter, the speaker, and the first transceiver, is powered by the transmitted power. In some embodiments, operation 418 is performed by a base station the same as or similar to base station 103 (shown in FIG. 1 and described herein).

At an operation 420, the order data packets are received, by the base station, as transmitted through the single pair of wires, and data packets based on the restaurant data packets are received. In some embodiments, operation 420 is performed by a base station the same as or similar to base station 103 (shown in FIG. 1 and described herein).

At an operation 422, the restaurant data packets are transmitted, by the base station, through the single pair of wires, and data packets based on the order data packets are transmitted. In some embodiments, operation 422 is performed by a base station the same as or similar to base station 103 (shown in FIG. 1 and described herein).

At an operation 424, the data packets based on the restaurant data packets are converted to the restaurant data packets, and the order data packets are converted to the data packets based on the order data packets. In some embodiments, operation 424 is performed by a converter the same as or similar to converter 22 (shown in FIG. 1 and described herein).

At an operation 426, subsequent to receipt, the data packets based on the order data packets are decoded into digital order signals that represent the sound received from the customer. In some embodiments, operation 426 is performed by a decoder the same as or similar to decoder 33 (shown in FIG. 1 and described herein).

At an operation 428, the digital order signals are converted to order signals. In some embodiments, operation 428 is performed by a digital-to-analog converter the same as or similar to digital-to-analog converter 34 (shown in FIG. 1 and described herein).

At an operation 430, order sound is generated based on the order signals, such that the generated order sound is audible to a staff member through a headset. In some embodiments, operation 430 is performed by a headset the same as or similar to headset 30 (shown in FIG. 1 and described herein).

At an operation 432, sound is captured, by the headset, from the staff member through one or more headset microphones. In some embodiments, operation 432 is performed by a headset the same as or similar to headset 30 (shown in FIG. 1 and described herein).

At an operation 434, restaurant information signals are generated that represent the sound captured from the staff member. In some embodiments, operation 434 is performed by a headset the same as or similar to headset 30 (shown in FIG. 1 and described herein).

At an operation 436, the restaurant information signals are converted to digital restaurant information signals. In some embodiments, operation 436 is performed by an analog-to-digital converter the same as or similar to analog-to-digital converter 35 (shown in FIG. 1 and described herein).

At an operation 438, digital restaurant information signals are encoded to form the data packets based on the restaurant data packets. In some embodiments, operation 438 is performed by an encoder the same as or similar to encoder 32 (shown in FIG. 1 and described herein).

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

What is claimed is:

1. An intercom communication system configured for one or more quick service restaurant drive-throughs, the drive-throughs including one or both of a menu board and a speaker post, the system comprising:
   an audio-order placement sub-system positionally associated with one or both of the menu board and the speaker post, the audio-order placement sub-system comprising:
      a microphone configured to capture sound from a customer placing an order at or near one or both of the menu board and the speaker post, and to generate order information signals that represent the sound captured from the customer, wherein the order information signals have an analog format;
      an analog-to-digital converter configured to receive the order information signals from the microphone and further configured to convert the order information signals to digital order information signals having a digital format;
      an order-placement encoder configured to encode the digital order information signals to form order data packets;
      an order-placement decoder configured to decode restaurant data packets from a base station into digital restaurant signals;
      a digital-to-analog converter configured to convert the digital restaurant signals into restaurant signals;
      a speaker configured to generate restaurant sound based on the restaurant signals such that the generated restaurant sound is audible to the customer at or near one or both of the menu board and the speaker post; and
      an order-placement transceiver configured to (i) transmit the order data packets from the audio-order placement sub-system to the base station through a single pair of wires, and (ii) receive the restaurant data packets from the base station through the single pair of wires;
      wherein at least one of the analog-to-digital converter, the digital-to-analog converter, the order-placement encoder, the order-placement decoder, the speaker, and the order-placement transceiver is powered by power transmitted from the base station through the single pair of wires;
   the single pair of wires, wherein the single pair of wires is communicatively coupled between the audio-order placement sub-system and the base station;
   the base station, the base station comprising:
      one or more base station transceivers configured to (i) receive the order data packets as transmitted through the single pair of wires by the order-placement transceiver of the audio-order placement sub-system, (ii) transmit data packets based on the order data packets to an audio-order receipt sub-system, (iii) receive data packets based on the restaurant data packets from the audio-order receipt sub-system, and (iv) transmit the restaurant data packets through the single pair of wires to the order-placement transceiver of the audio-order placement sub-system; and
      a converter configured to (i) convert the data packets based on the restaurant data packets to the restaurant data packets, and (ii) convert the order data packets to the data packets based on the order data packets; and
   the audio-order receipt sub-system located remotely from the audio-order placement sub-system, comprising:
      an order-receipt transceiver configured to (i) transmit the data packets based on the restaurant data packets from the audio-order receipt sub-system, and (ii) receive the data packets based on the order data packets from the audio-order receipt sub-system;
      an order-receipt decoder configured to decode the data packets based on the order data packets into digital order signals that represent the sound received from the customer;
      a digital-to-analog converter configured to convert the digital order signals to order signals;
      a headset configured to generate order sound based on the order signals, such that the generated order sound is audible to a staff member through the headset, wherein the headset is further configured to capture sound from the staff member through one or more headset microphones and to generate restaurant information signals that represent the sound captured from the staff member;
      an analog-to-digital converter configured to convert the restaurant information signals to digital restaurant information signals; and
      an order-receipt encoder configured to encode the digital restaurant information signals to form the data packets based on the restaurant data packets.

2. The system of claim 1, wherein the base station is configured to transmit the power that powers the at least one of the analog-to-digital converter, the digital-to-analog converter, the order-placement encoder, the order-placement decoder, the speaker, and the order-placement transceiver by applying a common voltage relative to ground to each wire in the single pair of wires.

3. The system of claim 1, wherein the base station is configured to transmit the power that powers the analog-to-digital converter, the digital-to-analog converter, the order-placement encoder, the order-placement decoder, the speaker, and the order-placement transceiver by applying a differential voltage between two wires in the single pair of wires.

4. The system of claim 1, wherein the order-placement encoder is configured to encode the digital order information signals to form the order data packets such that the order data packets are standardized and conform to a network communication standard, wherein the network communication standard is IEEE 1901.

5. The system of claim 1, wherein the single pair of wires is a twisted pair.

6. The system of claim 1, wherein the single pair of wires is included in a balanced cable.

7. The system of claim 1, wherein the intercom communication system is configured to use differential signaling over the single pair of wires.

8. The system of claim 1, wherein the intercom communication system further comprises a second audio-order placement sub-system positionally associated with one or both of a second menu board and a second speaker post, wherein the second audio-order placement sub-system is communicatively coupled to the base station through a second pair of wires.

9. The system of claim 8, wherein the second pair of wires extends from the audio-order placement sub-system such that data packets transmitted from the base station to the second audio-order placement sub-system are transmitted on the same pair of wires as the audio-order placement sub-system.

10. The system of claim 1, wherein the one or more base station transceivers are configured to transmit the data packets based on the order data packets wirelessly to the audio-order receipt sub-system, and to receive the data packets based on the restaurant data packets wirelessly from the audio-order receipt sub-system.

11. A method for facilitating intercom communication for one or more quick-service restaurant drive-throughs, the method comprising:
  capturing, by a first microphone, sound from a customer placing an order at or near one or both of a menu board and a speaker post positionally associated with a first drive-through lane, and generating order information signals that represent the sound captured from the customer, wherein the order information signals have an analog format;
  converting, by a first analog-to-digital converter, the order information signals to digital order information signals having a digital format;
  encoding, by a first encoder, the digital order information signals to form order data packets;
  decoding, by a first decoder, restaurant data packets from a base station into digital restaurant signals;
  converting, by a first digital-to-analog converter, the digital restaurant signals into restaurant signals;
  generating, by a speaker, restaurant sound based on the restaurant signals such that the generated restaurant sound is audible to the customer at or near one or both of the menu board and the speaker post;
  transmitting, by a first transceiver, the order data packets to the base station through a single pair of wires;
  receiving, by the first transceiver, the restaurant data packets from the base station through the single pair of wires;
  transmitting power through the single pair of wires, wherein at least one of the first analog-to-digital converter, the first encoder, the first decoder, the first digital-to-analog converter, the speaker, and the first transceiver, is powered by the transmitted power;
  receiving, by the base station, the order data packets as transmitted through the single pair of wires, and receiving data packets based on the restaurant data packets;
  transmitting, by the base station, the restaurant data packets through the single pair of wires, and transmitting data packets based on the order data packets;
  converting the data packets based on the restaurant data packets to the restaurant data packets, and the order data packets to the data packets based on the order data packets;
  decoding the data packets based on the order data packets into digital order signals that represent the sound received from the customer;
  converting the digital order signals to order signals;
  generating order sound based on the order signals, such that the generated order sound is audible to a staff member through a headset;
  capturing, by the headset, sound from the staff member through one or more headset microphones;
  generating restaurant information signals that represent the sound captured from the staff member;
  converting the restaurant information signals to digital restaurant information signals; and
  encoding the digital restaurant information signals to form the data packets based on the restaurant data packets.

12. The method of claim 11, wherein transmitting the power through the single pair of wires includes applying a differential voltage between two wires in the single pair of wires.

13. The method of claim 11, wherein the transmitted power powers the first analog-to-digital converter, the first encoder, the first decoder, the first digital-to-analog converter, the speaker, and the first transceiver.

14. The method of claim 11, wherein transmission over the single pair of wires is based on IEEE 1901.

15. The method of claim 11, wherein the single pair of wires is a twisted pair.

16. The method of claim 11, wherein transmitting the order data packets to the base station through the single pair of wires includes using differential signaling over the single pair of wires.

17. The method of claim 11, further comprising:
  communicatively coupling the base station with a second drive-through lane through a second pair of wires.

18. The method of claim 11, wherein the order data packets transmitted from the base station are transmitted wirelessly.

19. The method of claim 17, wherein the second pair of wires forms a point-to-point communicative coupling with the base station.

20. An intercom communication system configured for one or more quick service restaurant drive-throughs, the drive-throughs including one or both of a menu board and a speaker post, the system comprising:
  an audio-order placement sub-system positionally associated with one or both of the menu board and the speaker post, the audio-order placement sub-system comprising:

a microphone configured to capture sound from a customer placing an order at or near one or both of the menu board and the speaker post, and to generate digital order information signals that represent the sound captured from the customer;

an order-placement encoder configured to encode the digital order information signals to form order data packets;

an order-placement decoder configured to decode restaurant data packets from a base station into digital restaurant signals;

a digital-to-analog converter configured to convert the digital restaurant signals into restaurant signals;

a speaker configured to generate restaurant sound based on the restaurant signals such that the generated restaurant sound is audible to the customer at or near one or both of the menu board and the speaker post; and an order-placement transceiver configured to (i) transmit the order data packets from the audio-order placement sub-system to the base station through a single pair of wires, and (ii) receive the restaurant data packets from the base station through the single pair of wires;

wherein at least one of the digital-to-analog converter, the order-placement encoder, the order-placement decoder, the speaker, and the order-placement transceiver is powered by power transmitted from the base station through the single pair of wires;

the single pair of wires, wherein the single pair of wires is communicatively coupled between the audio-order placement sub-system and the base station;

the base station, the base station comprising:

a first base station transceiver configured to (i) receive the order data packets as transmitted through the single pair of wires by the order-placement transceiver of the audio-order placement sub-system, and (ii) transmit the restaurant data packets through the single pair of wires to the order-placement transceiver of the audio-order placement sub-system;

a second base station transceiver configured to (i) transmit data packets based on the order data packets to an audio-order receipt sub-system, and (ii) receive data packets based on the restaurant data packets from the audio-order receipt sub-system; and a converter configured to (i) convert the data packets based on the restaurant data packets to the restaurant data packets, and (ii) convert the order data packets to the data packets based on the order data packets; and the audio-order receipt sub-system located remotely from the audio-order placement sub-system, comprising:

an order-receipt transceiver configured to (i) transmit the data packets based on the restaurant data packets to the base station, and (ii) receive the data packets based on the order data packets from the base station;

an order-receipt decoder configured to decode the data packets based on the order data packets into digital order signals that represent the sound received from the customer; and an order-receipt encoder configured to encode restaurant information signals to form the data packets based on the restaurant data packets.

* * * * *